(12) United States Patent  (10) Patent No.: US 6,496,071 B1
Xavier  (45) Date of Patent: Dec. 17, 2002

(54) AMPLIFIER WITH ADJUSTABLE VOLTAGE GAIN AND METHOD OF OPERATING THE SAME

(75) Inventor: Bernard Xavier, Encinitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/939,224

(22) Filed: Aug. 25, 2001

(51) Int. Cl.[7] .................................................. H03G 3/12
(52) U.S. Cl. ........................ 330/283; 330/124; 330/285; 427/478
(58) Field of Search ................................. 330/134, 283, 330/285; 455/234.1, 239.1, 250.1; 327/309, 320, 325, 504, 489, 427, 478

(56) References Cited

U.S. PATENT DOCUMENTS 4,158,866 A  *  6/1979  Baker .......................... 361/86
5,247,207 A  *  9/1993  Wert et al. .................. 327/309

* cited by examiner

*Primary Examiner*—Terry D. Cunningham
*Assistant Examiner*—Long Nguyen

(57) ABSTRACT

An amplifier stage comprises a transistor, an output load, at least two resistive elements, and at least two control switches. The transistor has an input terminal, an output terminal and a ground terminal. The load has a first terminal coupled to the transistor output terminal and a second terminal coupled to a positive power supply source. A first resistive element comprises a first resistor having a first terminal and a second terminal, and a first diode having an anode coupled to the transistor ground terminal and a cathode coupled to the first terminal of the first resistor. A second resistive element comprises a second resistor having a first terminal and a second terminal, and a second diode having an anode coupled to the transistor ground terminal and a cathode coupled to the first terminal of second resistor. The first control switch couples the diode cathode to the positive power supply source. The second control switch couples the second diode cathode to the positive power supply source, wherein a gain of the amplifier stage is controlled by selectively closing the first and second control switches.

33 Claims, 3 Drawing Sheets

AMPLIFIER WITH ADJUSTABLE VOLTAGE GAIN AND METHOD OF OPERATING THE SAME

FIELD OF THE INVENTION

The present invention relates in general to integrated circuit technology and in particular to amplifier stages having adjustable voltage gains within an integrated circuit.

BACKGROUND OF THE INVENTION

The near-continuous development of more advanced mobile communication systems and related services have led to correspondingly low-priced and compact mobile devices that have become widely deployed. Mobile communication systems receive and amplify information signals that have widely varying amplitudes. These amplitude variations are caused by a combination of factors, including the distance between the transmitting base station and the receiving mobile device, the presence of varying obstacles in the transmission path of the signals, and the like. Variable gain amplifiers are commonly used to amplify such varying amplitude signals to a desired level.

Certain types of wireless receivers, such as wide-band CDMA receivers, require a wide range of gain control due to the large variations in the amplitudes of the received information signals. Such control may be provided by a series of cascaded transistor amplifier stages. Control switches in series with emitter resistors are used to vary the voltage-gain of such stages. When the required resolution in gain control is very fine, there may be a large number of resistors and switches per stage, which tends to increase parasitic capacitance observed at the emitter of each transistor. The parasitic capacitance then becomes a limiting factor of the frequency response and gain control resolution of the receiver circuit.

It is generally desirable to provide an improved integrated circuit layout in a receiver and in an amplifier stage in particular. It also is desirable to provide an improved integrated circuit layout so that the parasitic capacitance of the output transistor of an amplifier is not a limiting factor in the performance of the amplifier stage of a receiver.

SUMMARY OF THE INVENTION

The above-discussed deficiencies of the prior art are overcome by the present invention that provides an amplifier stage having an improved adjustable voltage gain within an integrated circuit. According to an advantageous embodiment of the present invention, an amplifier stage includes a transistor, an output load, first and second resistive elements, and first and second control switches.

The transistor includes an input terminal, an output terminal and a ground terminal. The output load has a first terminal coupled to the transistor output terminal and a second terminal coupled to a positive power supply source.

The first resistive element comprises a first resistor having a first terminal and a second terminal, and a first diode having an anode coupled to the transistor ground terminal and a cathode coupled to the first terminal of the first resistor. The second resistive element comprises a second resistor having a first terminal and a second terminal, and a second diode having an anode coupled to the transistor ground terminal and a cathode coupled to the first terminal of the second resistor.

The first control switch is capable of coupling the first diode cathode to the positive power supply source, and the second control switch is capable of coupling second diode cathode to the positive power supply source, wherein a gain of the amplifier stage is controlled by selectively closing first and second control switches.

In an advantageous related embodiment, the first and second resistive elements may further respectively comprise a first ground switch and a second ground switch. The first ground switch is capable of coupling the second terminal of the first resistor to ground when closed, and the second ground switch is capable of coupling the second terminal of the second resistor to ground when closed.

The amplifier stage of the present invention improves voltage gain control allowing a greater number of control branches than that of the PRIOR ART (introduced with respect to FIG. 1 hereafter). The cooperative introduction of the forward-biased diodes and control switches enables fine resolution in gain control, while reducing parasitic capacitance that occurs when a large number of switches and resistors are connected to the ground terminal.

It is understood multiple amplifier stages in accord herewith may suitably be cascaded to obtain a large range of gain control, with each individual stage having a sufficient number of gain control branches to obtain fine gain resolution. This implementation is, for instance, well suited for association with wireless receiver circuits, such as wide-band CDMA receivers or the like.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
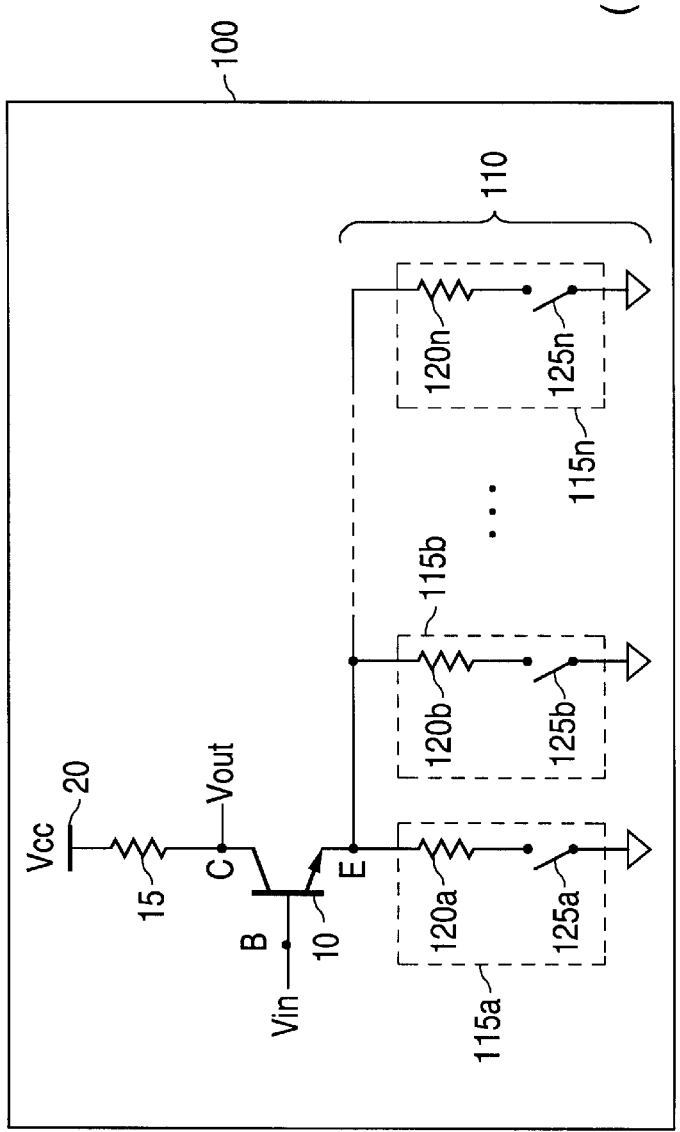
FIG. 1 schematically illustrates a PRIOR ART embodiment of a transistor amplifier stage that is widely used in wireless receiver circuitry.

FIG. 1 schematically illustrates a PRIOR ART embodiment of a transistor amplifier stage (generally designated 100) that is widely used in wireless receiver circuitry. PRIOR ART transistor amplifier stage 100 includes a transistor 10 and gain control circuitry (generally designated 110). A positive power supply voltage ($V_{cc}$) 20 is connected via resistor 15 to transistor 10.

Transistor 10 is a bi-polar junction transistor (BJT) having an input terminal (i.e., a base (B) terminal) coupled to an input voltage $V_{in}$, an output terminal (i.e., a collector (C) terminal) having an output voltage $V_{out}$, and a ground terminal (i.e., an emitter (E) terminal) that is coupled to PRIOR ART gain control circuitry 110.

PRIOR ART gain control circuitry 110 illustratively comprises a plurality of selectively switchable branches 115a–115n connected in parallel between the ground terminal (emitter) and ground. Each branch 115 comprises a series connection of a resistor (e.g., resistors 120a, 120b, 120n) and a ground switch (e.g., switches 125a, 125b, 125n). The voltage gain of transistor amplifier stage 100 may be controlled by selectively opening or closing switches 125a–125n in series with ground resistors 120a–120n.

Many such transistor amplifier stages may be cascaded to obtain a large range of gain control, as required by many wireless receiver circuits. However, when the required resolution in gain control is very fine, such that a large number of switches and resistors must be provided per stage, parasitic capacitance observed at the ground terminal of the bipolar transistor will be a limiting factor in frequency response of the same. In practice, no more than fifteen branches may be provided at the ground terminal without producing unacceptable levels of parasitic capacitance. In short, very fine gain control is not possible.

Figure 3:
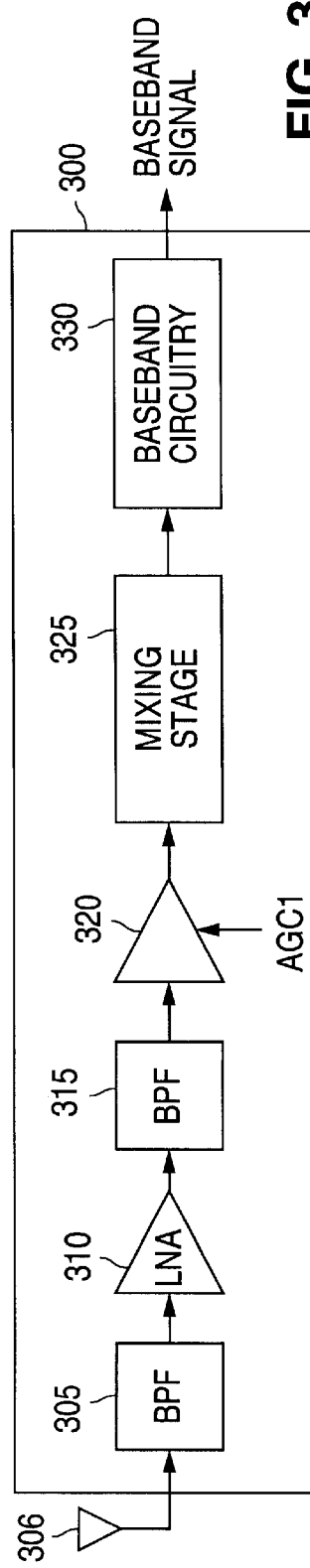
FIG. 3 schematically illustrates an exemplary embodiment of selected portions of the receive signal path of a receiver having a transistor amplifier stage according to one embodiment of the present invention.
Figure 2:
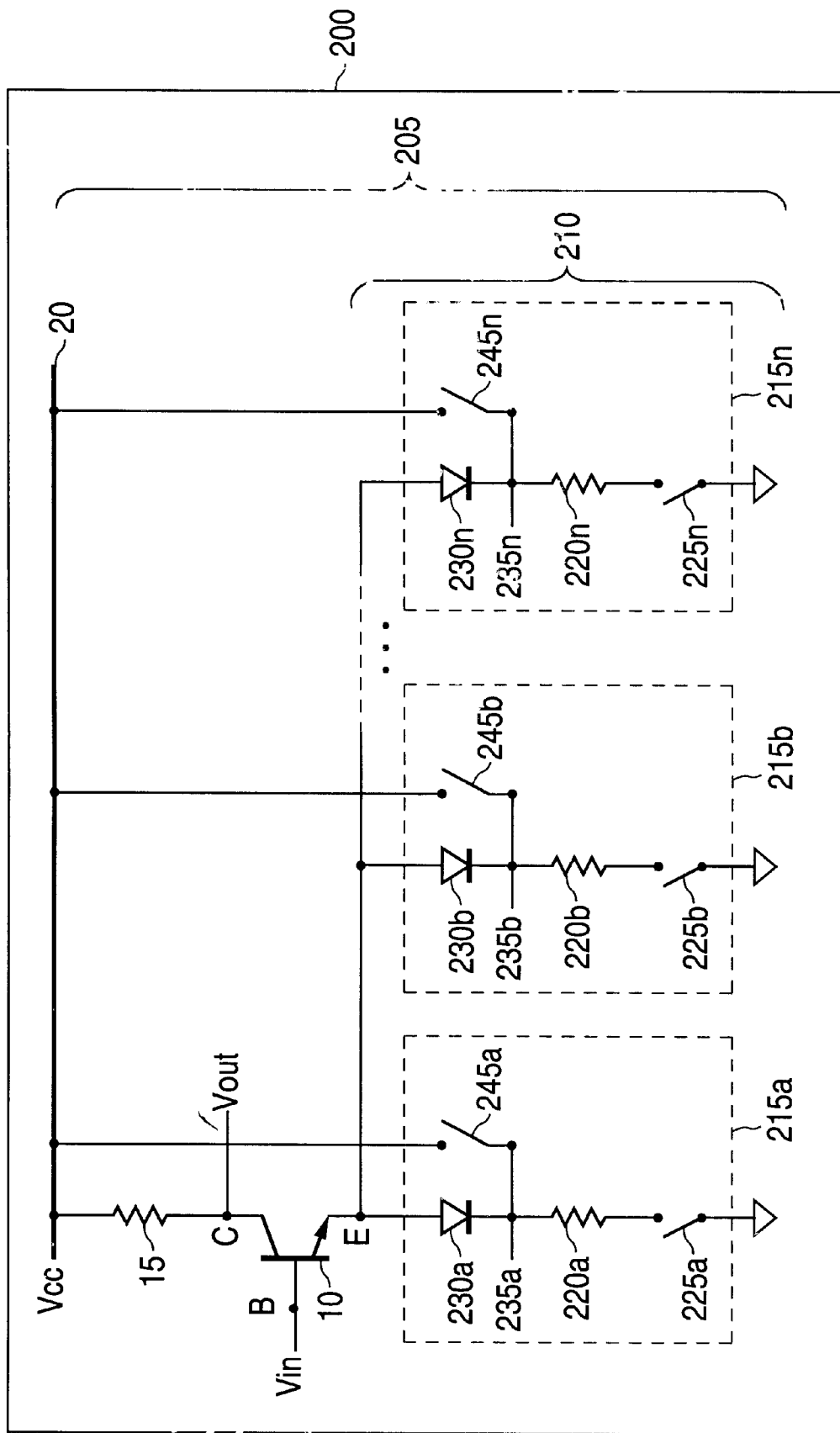
FIG. 2 schematically illustrates an exemplary embodiment of a transistor amplifier stage according to one embodiment of the present invention.
Figure 4:
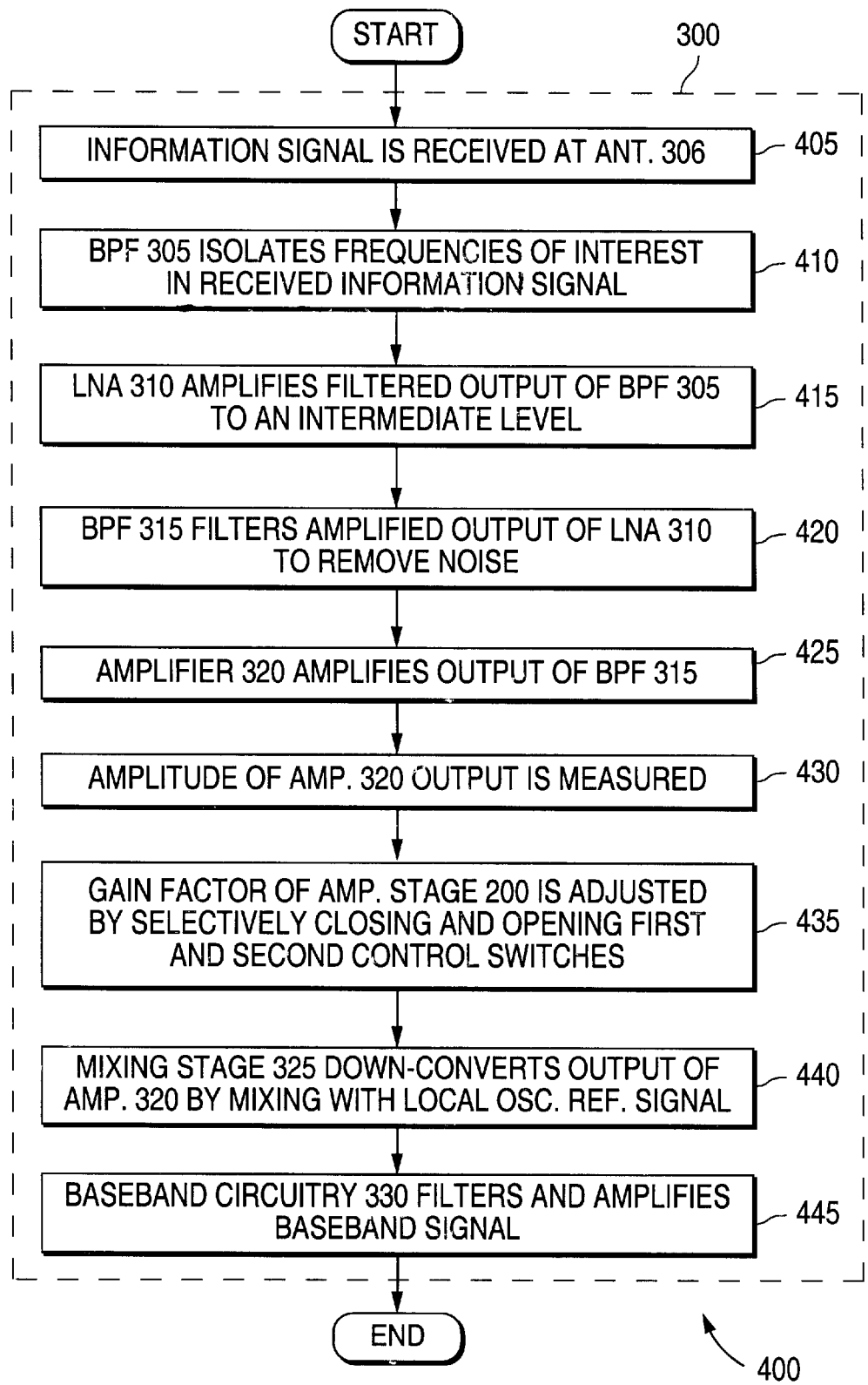
FIG. 4 illustrates a flow diagram of an exemplary method of operating the receiver of FIG. 3 having the transistor amplifier stage according to one embodiment of the present invention.

FIGS. 2 to 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged amplifier stage having adjustable voltage gain.

FIG. 2 schematically illustrates an exemplary embodiment of a transistor amplifier stage (generally designated 200) according to one embodiment of the present invention. Exemplary transistor amplifier stage 200 includes gain control circuitry (generally designated 205) that includes a transistor 10 and control switch circuitry (generally designated 210). A positive power supply voltage ($V_{cc}$) 20 is connected via resistor 15 to transistor 10.

Exemplary transistor 10 illustratively is a bi-polar junction transistor (BJT) having an input terminal (i.e., a base (B) terminal) coupled to an input voltage $V_{in}$, an output terminal (i.e., a collector (C) terminal) having an output voltage $V_{out}$, and a ground terminal (i.e., an emitter (E) terminal) that is associated with control switch circuitry 210 according to the present invention.

Those skilled in the art will understand that the use of a bi-polar junction transistor is by way of example only. The principles of the present invention may be implemented using a field-effect transistor (FET) without departing from the spirit and scope of the invention. In an embodiment employing a FET, the input terminal is the gate terminal of the FET, the output terminal is the drain terminal of the FET, and the ground terminal is the source terminal of the FET.

Exemplary control switch circuitry 210 illustratively comprises a plurality of selectively switchable branches 215a–215n connected in parallel between the ground terminal and ground. Each branch 215 comprises a series connection of a ground resistor (e.g., ground resistors 220a, 220b, 220n), a ground switch (e.g., ground switches 225a, 225b, 225n) and a diode (e.g., diodes 230a, 230b, 230n). Each branch 215 also comprises a junction 235 located between the negative terminal of diode 230 and ground resistor 220. Each junction 235a–235n is respectively coupled to positive power supply voltage 20 via one of lines 240a–240n. Each line 240 includes a control switch (e.g., control switches 245a, 245b, 245n), such that when any one of control switches 245a–245n is closed, then the negative terminal of a respective one of diode 230a–230n is pulled to the high potential at positive power supply voltage 20. This reverses biases diode 230.

According to the illustrative embodiment, each branch 215 has two switch positions. In a first switch position, when a particular one of the ground resistors, such as ground resistor 220x, is selected in order to vary the gain, the respective control switch 245x is opened and ground switch 225x is closed. In response, the corresponding diode 230x is ON and has a negligible effect on the circuit, causing only a slight current shift.

In a second switch position, when ground resistors 220x is deselected, the respective ground switch 225x is opened and control switch 245x is closed. In response, the negative terminal (cathode) of associated forward-biased diode 230x is connected to positive power supply voltage 20, pulling the negative terminal high and driving diode 230x into reverse bias. The low-series capacitance of diode 230x in reverse bias reduces the parasitic capacitance observed at the emitter terminal of the transistor 10.

Broadly, amplifier stage 200 according to the principles of the present invention minimally includes a transistor 10, an output load 15, a first resistive element, a second resistive element, a first control switch 245a and a second control switch 245n. Transistor 10 has an input terminal, an output terminal and a ground terminal. Output load 15 has a first terminal coupled to the output terminal of transistor 10 and a second terminal coupled to a positive power supply source 20. The first resistive element comprising a first resistor 220a having a first terminal and a second terminal, and a first diode 230a having an anode coupled to the ground terminal of transistor 10 and a cathode coupled to the first terminal of first resistor 220a. The second resistive element comprises a second resistor 220n having a first terminal and a second terminal, and a second diode 230n having an anode coupled to the ground terminal of transistor 10 and a cathode coupled to the first terminal of second resistor 220n. First control switch 245a is capable of coupling first diode 230 a cathode to positive power supply source 20, and second control switch 245n is capable of coupling second diode 230n cathode to positive power supply source 20, wherein a gain of amplifier stage 200 is controlled by selectively closing first and second control switches 245a; 245n.

Those skilled in the art will understand that ground switches 225a–225n, though advantageous to the above-introduced illustrative embodiment, are not necessary elements hereto. However, with respect to the illustrative embodiment, the at least two resistive elements may further respectively comprise a first ground switch 225a and a second ground switch 225n. First ground switch 225a capable of coupling the second terminal of first resistor 220a to ground when closed, and second ground switch 225n capable of coupling the second terminal of second resistor 220n to ground when closed.

Amplifier stage 200 improves voltage gain control allowing a greater number of control branches that the PRIOR ART, as illustrated in FIG. 1. The cooperative introduction of forward-biased diodes 230a–230n and control switches 245a–245n enables fine resolution in gain control, while reducing parasitic capacitance that occurs when a large number of switches and resistors are connected to the ground terminal.

It is understood multiple amplifier stages 200 may suitably be cascaded to obtain a large range of gain control, with each individual stage having a sufficient number of gain control branches 215a–215n to obtain fine gain resolution. This implementation is, for instance, well suited for association with wireless receiver circuits, such as wide-band CDMA receivers or the like.

FIG. 3 schematically illustrates an exemplary embodiment of selected portions of the receive signal path of a receiver 300 having a transistor amplifier stage 200 according to one embodiment of the present invention. Exemplary receiver 300 may be implemented in any conventional suitably arranged one-way or two-way communication device, including a cell phone, a wireless network card, a two-way pager, or the like. For the purpose of simplifying the explanation of the present invention, the transmitter portion of a two-way communication embodiment of the present invention is not shown.

The receive path through receiver 300 comprises band pass filter (BPF) 305, which receives an incoming signal from antenna 306. The receive path further comprises low-noise amplifier (LNA) 310, band pass filter (BPF) 315, amplifier 320, mixing stage 325, and baseband circuitry 330.

According to one advantageous embodiment, an amplifier stage 200 (not shown; cascaded or otherwise in accord with the principles of the present invention) may suitably be associated with amplifier 320 of receiver 300. In alternate embodiments, amplifier stage 200 may be suitably associated with any of the elements of receiver 300 needing an amplifier stage with voltage gain control.

Those skilled in the art will recognize that, according to alternate embodiments of the present invention, one or more of BPF 305 and BPF 315 may be other types of filters, including low pass filters. The choice of bandpass filters in the exemplary embodiment described above is by way illustration only and should not be construed so as to limit the scope of the present invention.

FIG. 4 illustrates a flow diagram of an exemplary method of operating (generally designated 400) receiver 300 of FIG. 3 having amplifier 320 having a transistor amplifier stage 200 according to one embodiment of the present invention. The description of FIG. 4 is undertaken with concurrent reference to the illustrative embodiments of amplifier stage 200 and receiver 300 of FIGS. 2 and 3.

Exemplary method 400 of operating receiver 300 having at least one amplifier stage 200 (that is integrated into amplifier 320), begins upon receiving an information signal at antenna 306 (process step 405).

Exemplary BPF 305 isolates the frequencies of interest in the received information signal from antenna 306 and filters out unwanted frequency bands (process step 410). Exemplary LNA 310 amplifies the filtered output of BPF 305 to an intermediate level (process step 415). Exemplary BPF 315 further filters the amplified output of LNA 310 to remove noise outside of the desired receiver frequency range that were amplified by, or introduced by, LNA 310 (Process step 420).

Exemplary amplifier 320 further amplifies the output of BPF 315 by a variable amount of gain determined by a gain control signal AGC1. According to this embodiment, amplifier stage 200, associated with amplifier 320, includes:

a transistor having an input terminal, an output terminal and a ground terminal, an output load having a first terminal coupled to the transistor output terminal and a second terminal coupled to a positive power supply source, a first resistive element comprising a first resistor having a first terminal and a second terminal, and a first diode having an anode coupled to the transistor ground terminal and a cathode coupled to the first terminal of the first resistor, a second resistive element comprising a second resistor having a first terminal and a second terminal, and a second diode having an anode coupled to the transistor ground terminal and a cathode coupled to the first terminal of second resistor, a first control switch capable of coupling the first diode cathode to the positive power supply source, and a second control switch capable of coupling the second diode cathode to the positive power supply source.

Amplifier 320 operates to amplify the output of BPF 315 (Process step 425), measure an amplitude of the amplified the output of BPF 315 (Process step 430), and selectively adjust a gain factor of amplifier stage 200 by selectively closing and opening first and second control switches (Process step 435).

Mixing stage 325 down-converts the output of amplifier 320 by mixing it with a local oscillator reference signal (Process step 440). Mixing stage 325 effectively shifts the information signal centered around the receiver operating frequency down to a baseband signal.

Baseband circuitry 330 comprises additional filtering circuitry and automatic gain control circuitry that further improve the quality of the baseband signal from mixing stage 325 (Process step 445).

The above examples and description have been provided only for the purpose of illustration, and are not intended to limit the invention in any way. As will be appreciated by the skilled person, the invention can be carried out in a great variety of ways, employing more than one technique from those describe above, all without exceeding the scope of the invention.

What is claimed is:

1. An amplifier stage comprising:

a transistor having an input terminal, an output terminal and a ground terminal;

an output load having a first terminal coupled to said transistor output terminal and a second terminal coupled to a positive power supply source;

a first resistive element comprising a first resistor having a first terminal and a second terminal, and a first diode having an anode coupled to said transistor ground terminal and a cathode coupled to said first terminal of said first resistor;

a second resistive element comprising a second resistor having a first terminal and a second terminal, and a second diode having an anode coupled to said transistor ground terminal and a cathode coupled to said first terminal of second resistor;

a first control switch capable of coupling said first diode cathode to said positive power supply source; and a second control switch capable of coupling said second diode cathode to said positive power supply source, wherein a gain of said amplifier stage is controlled by selectively closing said first and second control switches.

2. The amplifier stage set forth in claim 1 wherein said transistor is a biased junction transistor, said input terminal is a base terminal of said bipolar junction transistor, said output terminal is a collector terminal of said biased junction transistor, and said ground terminal is an emitter terminal of said biased junction transistor.

3. The amplifier stage set forth in claim 2 wherein said first resistive element further comprises a first ground switch capable of coupling said second terminal of said first resistor to ground when closed.

4. The amplifier stage set forth in claim 3 wherein said first ground switch is open when said first control switch is closed and wherein said first ground switch is closed when said first control switch is open.

5. The amplifier stage set forth in claim 2 wherein said second resistive element further comprises a second ground switch capable of coupling said second terminal of said second resistor to ground when closed.

6. The amplifier stage set forth in claim 5 wherein said second ground switch is open when said second control switch is closed and wherein said second ground switch is closed when said second control switch is open.

7. The amplifier stage set forth in claim 1 wherein said transistor is a field-effect transistor, said input terminal is a gate terminal of said field-effect transistor, said output terminal is a drain terminal of said field-effect transistor, and said ground terminal is a source terminal of said field-effect transistor.

8. The amplifier stage set forth in claim 7 wherein said first resistive element further comprises a first ground switch capable of coupling said second terminal of said first resistor to ground when closed.

9. The amplifier stage set forth in claim 8 wherein said first ground switch is open when said first control switch is closed and wherein said first ground switch is closed when said first control switch is open.

10. The amplifier stage set forth in claim 7 wherein second resistive element further comprises a second ground switch capable of coupling said second terminal of said second resistor to ground when closed.

11. The amplifier stage set forth in claim 10 wherein said second ground switch is open when said second control switch is closed and wherein said second ground switch is closed when said second control switch is open.

12. A receiver comprising:

a receiver front-end circuit capable of receiving an incoming information signal from an antenna; and an amplifier stage, associated with said receiver front-end circuit, comprising:

a transistor having an input terminal, an output terminal and a ground terminal;

an output load having a first terminal coupled to said transistor output terminal and a second terminal coupled to a positive power supply source;

a first resistive element comprising a first resistor having a first terminal and a second terminal, and a first diode having an anode coupled to said transistor ground terminal and a cathode coupled to said first terminal of said first resistor;

a second resistive element comprising a second resistor having a first terminal and a second terminal, and a second diode having an anode coupled to said transistor ground terminal and a cathode coupled to said first terminal of second resistor;

a first control switch capable of coupling said first diode cathode to said positive power supply source; and a second control switch capable of coupling said second diode cathode to said positive power supply source, wherein a gain of said amplifier stage is controlled by selectively closing said first and second control switches.

13. The receiver set forth in claim 12 wherein said transistor is a biased junction transistor, said input terminal is a base terminal of said bipolar junction transistor, said output terminal is a collector terminal of said biased junction transistor, and said ground terminal is an emitter terminal of said biased junction transistor.

14. The receiver set forth in claim 13 wherein said first resistive element further comprises a first ground switch capable of coupling said second terminal of said first resistor to ground when closed.

15. The receiver set forth in claim 14 wherein said first ground switch is open when said first control switch is closed and wherein said first ground switch is closed when said first control switch is open.

16. The receiver set forth in claim 13 wherein said second resistive element further comprises a second ground switch capable of coupling said second terminal of said second resistor to ground when closed.

17. The receiver set forth in claim 16 wherein said second ground switch is open when said second control switch is closed and wherein said second ground switch is closed when said second control switch is open.

18. The receiver set forth in claim 12 wherein said transistor is a field-effect transistor, said input terminal is a gate terminal of said field-effect transistor, said output terminal is a drain terminal of said field-effect transistor, and said ground terminal is a source terminal of said field-effect transistor.

19. The receiver set forth in claim 18 wherein said first resistive element further comprises a first ground switch capable of coupling said second terminal of said first resistor to ground when closed.

20. The receiver set forth in claim 19 wherein said first ground switch is open when said first control switch is closed and wherein said first ground switch is closed when said first control switch is open.

21. The receiver set forth in claim 18 wherein said second resistive element further comprises a second ground switch capable of coupling said second terminal of said second resistor to ground when closed.

22. The receiver set forth in claim 21 wherein said second ground switch is open when said second control switch is closed and wherein said second ground switch is closed when said second control switch is open.

23. A method of operating a receiver having at least one amplifier stage comprising, (i) a transistor having an input terminal, an output terminal and a ground terminal, (ii) an output load having a first terminal coupled to said transistor output terminal and a second terminal coupled to a positive power supply source, (iii) a first resistive element comprising a first resistor having a first terminal and a second terminal, and a first diode having an anode coupled to said transistor ground terminal and a cathode coupled to said first terminal of said first resistor, (iv) a second resistive element comprising a second resistor having a first terminal and a second terminal, and a second diode having an anode coupled to said transistor ground terminal and a cathode coupled to said first terminal of second resistor, (v) a first control switch capable of coupling said first diode cathode to said positive power supply source, and (vi) a second control switch capable of coupling said second diode cathode to said positive power supply source, said method comprising the steps of:

receiving an incoming information signal;

amplifying said incoming information signal;

measuring an amplitude of said amplified incoming information signal; and selectively adjusting a gain factor of said amplifier stage by selectively closing and opening said first and second control switches.

24. The method of operating receiver set forth in claim 23 wherein said transistor is a biased junction transistor, said input terminal is a base terminal of said bipolar junction transistor, said output terminal is a collector terminal of said biased junction transistor, and said ground terminal is an emitter terminal of said biased junction transistor.

25. The method of operating receiver set forth in claim 24 wherein said first resistive element further comprises a first ground switch capable of coupling said second terminal of said first resistor to ground when closed.

26. The method of operating receiver set forth in claim 25 wherein said first ground switch is open when said first control switch is closed and wherein said first ground switch is closed when said first control switch is open.

27. The method of operating receiver set forth in claim 26 wherein said second resistive element further comprises a second ground switch capable of coupling said second terminal of said second resistor to ground when closed.

28. The method of operating receiver set forth in claim 27 wherein said second ground switch is open when said second control switch is closed and wherein said second ground switch is closed when said second control switch is open.

29. The method of operating receiver set forth in claim 23 wherein said transistor is a field-effect transistor, said input terminal is a gate terminal of said field-effect transistor, said output terminal is a drain terminal of said field-effect transistor, and said ground terminal is a source terminal of said field-effect transistor.

30. The method of operating receiver set forth in claim 29 wherein said first resistive element further comprises a first ground switch capable of coupling said second terminal of said first resistor to ground when closed.

31. The method of operating receiver set forth in claim 30 wherein said first ground switch is open when said first control switch is closed and wherein said first ground switch is closed when said first control switch is open.

32. The method of operating receiver set forth in claim 29 wherein said second resistive element further comprises a second ground switch capable of coupling said second terminal of said second resistor to ground when closed.

33. The method of operating receiver set forth in claim 32 wherein said second ground switch is open when said second control switch is closed and wherein said second ground switch is closed when said second control switch is open.

* * * * *